United States Patent
Peschke

(10) Patent No.: US 10,718,793 B2
(45) Date of Patent: Jul. 21, 2020

(54) OSCILLOSCOPE, TEST AND MEASUREMENT SYSTEM AS WELL AS METHOD

(71) Applicant: Rohde & Schwarz GmbH & Co. KG, Munich (DE)

(72) Inventor: Martin Peschke, Vaterstetten (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 141 days.

(21) Appl. No.: 15/981,500

(22) Filed: May 16, 2018

(65) Prior Publication Data

US 2018/0335452 A1    Nov. 22, 2018

(30) Foreign Application Priority Data

May 18, 2017   (EP) .................................. 17171815

(51) Int. Cl.
*G01R 13/02* (2006.01)
*G01R 1/067* (2006.01)
*G01R 35/00* (2006.01)

(52) U.S. Cl.
CPC ..... *G01R 13/0272* (2013.01); *G01R 1/06788* (2013.01); *G01R 13/0218* (2013.01); *G01R 13/0254* (2013.01); *G01R 35/005* (2013.01)

(58) Field of Classification Search
CPC ............ G01R 13/0272; G01R 13/0218; G01R 13/0254; G01R 1/06788; G01R 35/005
USPC .................................................... 324/76.24
See application file for complete search history.

(56) References Cited

U.S. PATENT DOCUMENTS

| 6,064,312 | A | 5/2000 | Weller |
| 6,351,112 | B1 | 2/2002 | Felps et al. |
| 6,801,042 | B2 * | 10/2004 | McPherson ............ G01R 35/02 |
| | | | 324/601 |
| 2015/0168530 | A1 | 6/2015 | Mende et al. |

OTHER PUBLICATIONS

Tektronix ("MDO3000 Series Mixed Domain Oscilloscopes User Manual"; Pub. Date Feb. 25, 2014; Tektronix; p. 11-13, 36; Downloaded from https://www.tek.com/oscilloscope/mdo3000-mixed-domain-oscilloscope-manual/mdo3000-series-0) (Year: 2014).*
Agilent ("Understanding Oscilloscope Probe Correction Application Note"; Pub. Date Sep. 2, 2011; Agilent Technologies; p. 1-2) (Year: 2011).*

* cited by examiner

*Primary Examiner* — Melissa J Koval
*Assistant Examiner* — Rahul Maini
(74) *Attorney, Agent, or Firm* — Christensen O'Connor Johnson Kindness PLLC

(57) ABSTRACT

An oscilloscope is described that has a compensation signal generator configured to generate a compensation signal, a probe connector configured to be connected to the passive probe and a detection unit configured to detect whether the passive probe is connected to the probe connector or not. Further, a test and measurement system and a method are described.

14 Claims, 2 Drawing Sheets

OSCILLOSCOPE, TEST AND MEASUREMENT SYSTEM AS WELL AS METHOD

FIELD OF THE DISCLOSURE

Embodiments of the present disclosure relate generally to an oscilloscope, a test and a measurement system as well as a method for compensating a passive probe.

BACKGROUND

It is known that oscilloscopes are used in connection with passive probes for contacting a device under test. The oscilloscope and the passive probe establish a test and measurement system.

Passive probes are known that have a trimmer for capacity which is used for adapting the passive probe with regard to the input capacity of the oscilloscope, for example the measurement channel of the oscilloscope being used. This is also called probe compensation which has to be performed prior to measuring a device under test by using the oscilloscope and the passive probe.

This probe compensation has to be done every time when the passive probe is connected with the oscilloscope. In case the probe compensation has not been done, the measurements performed with the test and measurement system are not usable due to errors related to a mismatch due to the missing probe compensation.

The probe compensation is typically done by connecting the passive probe with the oscilloscope and selecting the channel that is connected to the passive probe. Further, it is required to adapt the settings of the oscilloscope appropriately by adapting certain characteristics, for instance the triggered threshold in an appropriate manner. In addition, several other settings have to be done such as selecting a horizontal scaling, a vertical scaling, an offset, a position, a trigger source, a trigger level, and an averaging. These different settings have to be done manually in order to set the channel of the oscilloscope correctly that is used for probe compensation.

Afterwards, the oscilloscope has to be reset manually such that the settings are applied that are used for the measurement in order to perform the measurements intended by using the test and measurement system.

Accordingly, there is a need for a more efficient possibility to perform probe compensation such that measurements can be done in a more efficient manner.

SUMMARY

Embodiments of the present disclosure provide an oscilloscope with a compensation signal generator configured to generate a compensation signal, a probe connector configured to be connected to the passive probe and a detection unit configured to detect whether the passive probe is connected to the probe connector or not.

Further, embodiments of the present disclosure provide a method for compensating a passive probe, with the following steps:

detecting a passive probe connected to an oscilloscope;
starting a probe compensation mode if a passive probe is detected; and
adjusting at least one setting of the oscilloscope in the probe compensation mode.

Accordingly, the oscilloscope has a specific probe compensation output which is provided by the probe connector. The specific probe compensation output of the oscilloscope is configured to enable probe compensation in an automatic manner. Further, it is automatically detected if the passive probe is connected to the oscilloscope such that the probe compensation can be initiated by starting a probe compensation mode of the oscilloscope. The internal compensation signal generator generates a specific compensation signal for probe compensation. This compensation signal is forwarded to the passive probe, for example its tip that is used for sensing the probe connector. In the probe compensation mode, the oscilloscope interacts with the passive probe such that a probe trimmer of the passive probe is adjusted (automatically) until a trace relating to the compensation signal generated is within a tolerance range. The tolerance range may be defined by the manufacturer of the oscilloscope. Further, the tolerance range may be set by a user of the oscilloscope.

For instance, the compensation signal generator is connected with the probe connector such that the compensation signal generated is forwarded to the probe connector.

The detection unit may be configured to automatically detect whether the passive probe is connected to the probe connector or not.

A probe compensation is initiated by starting a probe compensation mode of the oscilloscope if the passive probe is connected to the oscilloscope.

According to an aspect, the compensation signal generator is configured to generate a periodic signal, for example at least one of a rectangular signal and a sinusoidal signal. This simplifies the probe compensation as a repetitive signal is applied to the passive probe which is used for adjusting the probe trimmer of the passive probe.

In some embodiments, the passive probe is a passive voltage probe.

According to another aspect, the compensation signal generator is connected with the probe connector such that the compensation signal generated is forwarded to the probe connector. The forwarded compensation signal is fed to the passive probe connected to the probe connector.

The passive probe may be connected with at least one of the inputs of the oscilloscope such that the compensation signal generated is forwarded to the passive probe which processes the compensation signal. The oscilloscope receives at its input a received compensation signal corresponding to the compensation signal generated. The compensation signal generated and the received one are compared with each other in order to determine a deviation, for example from the expected shape of the signal received. Then, the trimmer at the passive probe is adjusted until the trace of the received compensation signal meets the compensation signal generated within the tolerance area.

According to a certain embodiment, the probe connector comprises two terminals, for example wherein at least one of the terminals is established by at least one of a lug, a hook, a loop, and a socket. The passive probe may contact these terminals in an easy and efficient manner such that the compensation signal provided can be sensed by the passive probe efficiently, for example its tip.

Further, the detection unit may comprise at least one of a mechanism, a sensor, and an electric switch. The mechanism is used in order to detect the connection of the passive probe with the probe connector in a mechanical manner. Further, an electrical switch may be provided that is activated when the passive probe is connected to the probe connector. Moreover, the sensor may be a pressure sensor, an optical sensor like a light barrier or an impedance sensor sensing the impedance of the probe connector that various when the probe is connected to the probe connector. Typically, the impedance increases if the passive probe is disconnected. Thus, the connection can be sensed in a mechanical, electrical or optical manner.

According to another aspect, the detection unit and the compensation signal generator are electrically connected with each other, for example wherein the detection unit is configured to control the compensation signal generator. Therefore, the compensation signal generator does not have to continuously provide a compensation signal as the detection unit starts the compensation signal generator provided that the detection unit detects that the passive probe is connected to the probe connector. Accordingly, the detection unit acts as a switching unit for the compensation signal generator. This ensures that unwanted interferences radiated at the probe connector can be avoided. The detection unit may start a certain probe compensation mode of the oscilloscope in which the compensation signal generator is activated appropriately.

Moreover, the oscilloscope may be configured to automatically determine the divider factor of the probe connected to the probe connector. For instance, the amplitude of the compensation signal received by the input channel connected to the passive probe is measured. Therefore, parameters of the passive probe may be obtained during the probe compensation.

Furthermore, a display may be provided that is configured to display a probe compensation template in a probe compensation mode. This probe compensation template helps the user of the oscilloscope to make a proper probe adjustment. Alternatively or supplementary, an indicator is illustrated in the probe compensation template wherein the indicator indicates at least one of quality of the adjustment, warning message, and adjustment wizard. Accordingly, the probe compensation template may guide the user appropriately.

According to another aspect, the setting is at least one of active channel, disabled channel, horizontal scaling, vertical scaling, offset, position, trigger source, trigger level, and averaging. These settings are typically set while adapting the oscilloscope.

Moreover, the setting may be adjusted automatically. Up to now, the above mentioned settings have to be done by the user manually when starting probe compensation. Thus, efficient probe compensation is ensured as these settings are adjusted automatically by the oscilloscope.

According to another aspect, the original settings of the oscilloscope are stored prior to the adjusting step, wherein the original settings are restored after a detection unit detects the disconnection of the probe. Thus, the user does not have to reset its oscilloscope after the probe compensation since the prior settings of the oscilloscope also labeled as original settings are temporarily stored, for example buffered, such that they can be retrieved afterwards for performing the measurement intended. Accordingly, the oscilloscope is set in its previous mode with regard to the settings once the passive probe is disconnected from the probe connector of the oscilloscope as this indicates that the probe compensation mode is finished. The disconnection is sensed by the detection unit in an appropriate manner wherein the detection may be done in a mechanical, electrical or optical manner.

According to another aspect, triggering is performed on the clock of the oscilloscope. Thus, the compensation signal generated may have a frequency relating to the clock frequency of the oscilloscope. As it is quite cumbersome to automatically detect to which input channel the passive probe to be compensated is connected, the trigging on the system clock of the oscilloscope simplifies this detection. This can be simplified as the oscilloscope generates the compensation signal internally such that the compensation signal is phase locked to the internal clock. Accordingly, a priori knowledge of the compensation signal is provided, for example regarding its shape and/or phase. Setting the scope trigger on the clock instead of the measured signal results in a signal displayed stationary only at that input channel that process the compensation signal generated.

Generally, the compensation signal generated may be searched by switching between alternating current and direct current coupling on all channels possible in order to detect the input channel of the oscilloscope that is connected to the passive probe.

Moreover, the divider factor of the probe may be determined automatically by the oscilloscope. Therefore, a parameter of the passive probe itself can be obtained during the probe compensation simultaneously. For instance, this parameter can be determined for passive probes without any read out pin in an easy manner.

In some embodiments, the amplitude of a compensation signal received is measured in order to determine the divider factor of the probe. Thus, the divider factor can be obtained without additional efforts as the passive probe is connected to the probe connector and one of the several input channels of the oscilloscope during the probe compensation.

Further, embodiments of the present disclosure also provide a test and measurement system comprising a probe and the oscilloscope as described above. The probe is connected to at least one of several input channels of the oscilloscope. During the compensation mode, the passive probe is also connected to the probe connector of the oscilloscope in order to receive the compensation signal generated by the compensation signal generator.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
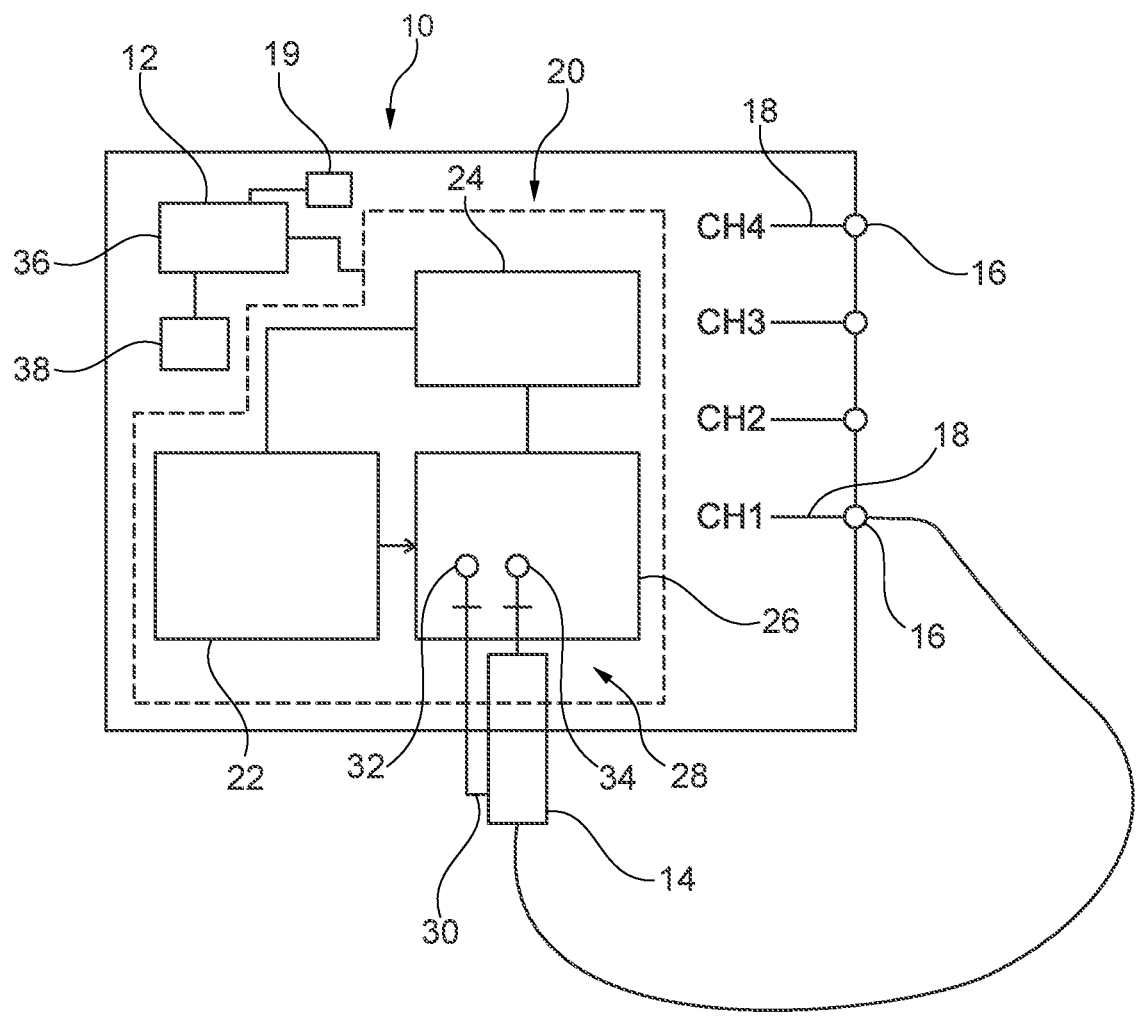
FIG. 1 shows a schematic overview of a test and measurement system according to an embodiment of the present disclosure.

In FIG. 1, a test and measurement system 10 is shown that comprises an oscilloscope 12 and a passive probe 14 that are connected with each other. In the shown embodiment, the oscilloscope 12 has four inputs 16 that are allocated to four input channels 18. The input channels 18 are labeled by CH1, CH2, CH3, and CH4. The passive probe 14 is connected to the first input channel 18 (CH1) such that signals sensed by the passive probe 14 are forwarded to the first input channel 18 of the oscilloscope 12.

The oscilloscope 12 comprises a display 19 that is inter alia used for illustrating signals received via the inputs 16. In addition, the oscilloscope 12 has a compensation unit 20 that is configured to support the adjustment of the probe 14, for example probe compensation, as will be described later. In some embodiments, the oscilloscope 12 or the compensation unit 20 comprises a compensation signal generator 22, a detection unit 24 as well as a probe connector 26.

As shown in FIG. 1, the passive probe 14 is connected to the probe connector 26 via its tip 28 and a grounding line 30. The probe connector 26 comprises two terminals 32, 34 that are established by two lugs in the shown embodiment. Alternatively, the terminals 32, 34 may be established by at least one of a hook, a loop, and a socket. Therefore, different connection means may be provided for contacting the probe connector 26 by the passive probe 14, for example its tip 28 and the grounding line 30.

Figure 2:
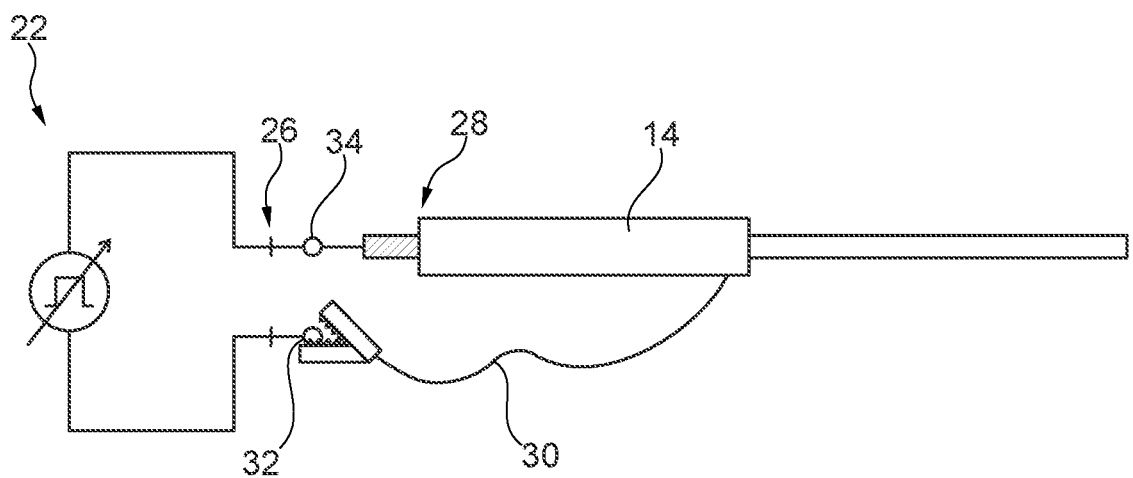
FIG. 2 shows a detail of FIG. 1 in a schematic illustration.

As shown in FIG. 2, the grounding line 30 is connected to the probe connector 26, for example the first terminal 32, via an alligator clamp that is provided at the end of the grounding line 30.

In general, the oscilloscope 12, for example the compensation unit 20, is configured to at least facilitate compensation of the passive probe 14 while the input capacity of the oscilloscope 12 at the input 16 chosen being adapted easily by setting the oscilloscope 12 in an appropriate manner. For adapting the settings, the oscilloscope 12 comprises a processing and control unit 36 that is connected to the compensation unit 20 as shown in FIG. 1. The processing and control unit 36 can be embodied in a special-purpose computer, application specific integrated circuit (ASIC), a controller or data processor that is specifically programmed, etc., configured or constructed to perform one or more of the methodologies described herein. Of course, any logic or algorithm described herein can be implemented in software or hardware, or a combination of software and hardware.

The detection unit 24 detects whether the passive probe 14 is connected to the probe connector 26. Therefore, the detection unit 24 may comprise a mechanism in order to detect the connection in a mechanical manner. Alternatively or supplementary, the detection unit 24 may comprise an electrical switch that is activated when the passive probe 14 is connected to the probe connector 26 such that an electrical signal is initiated which is processed appropriately. Moreover, the detection unit 24 may comprise a sensor such as a pressure sensor, an optical sensor or an impedance sensor. For instance, the impedance at the probe connector 26 is checked wherein a threshold value is given as the impedance is increased once the probe 14 is connected to the probe connector 26.

Accordingly, the detection unit 24 is configured to detect the connection of the passive probe 14 in a mechanical, electrical or optical manner.

Once the detection unit 24 detects that the probe connector 14 is connected to the probe connector 26, the detection unit 24 activates the compensation signal generator 22 to generate a compensation signal that is forwarded to the probe connector 26. The compensation signal generated is forwarded to the prove connector in order to be sensed by the probe 14, for example its tip 28. Accordingly, it is not necessary that the compensation signal generator 22 continuously generates a signal which may interfere during the measurements.

The compensation signal generator 22 is configured to generate a periodic signal such as a rectangular signal or a sinusoidal signal that is applied to the probe connector 26.

Figure 3:
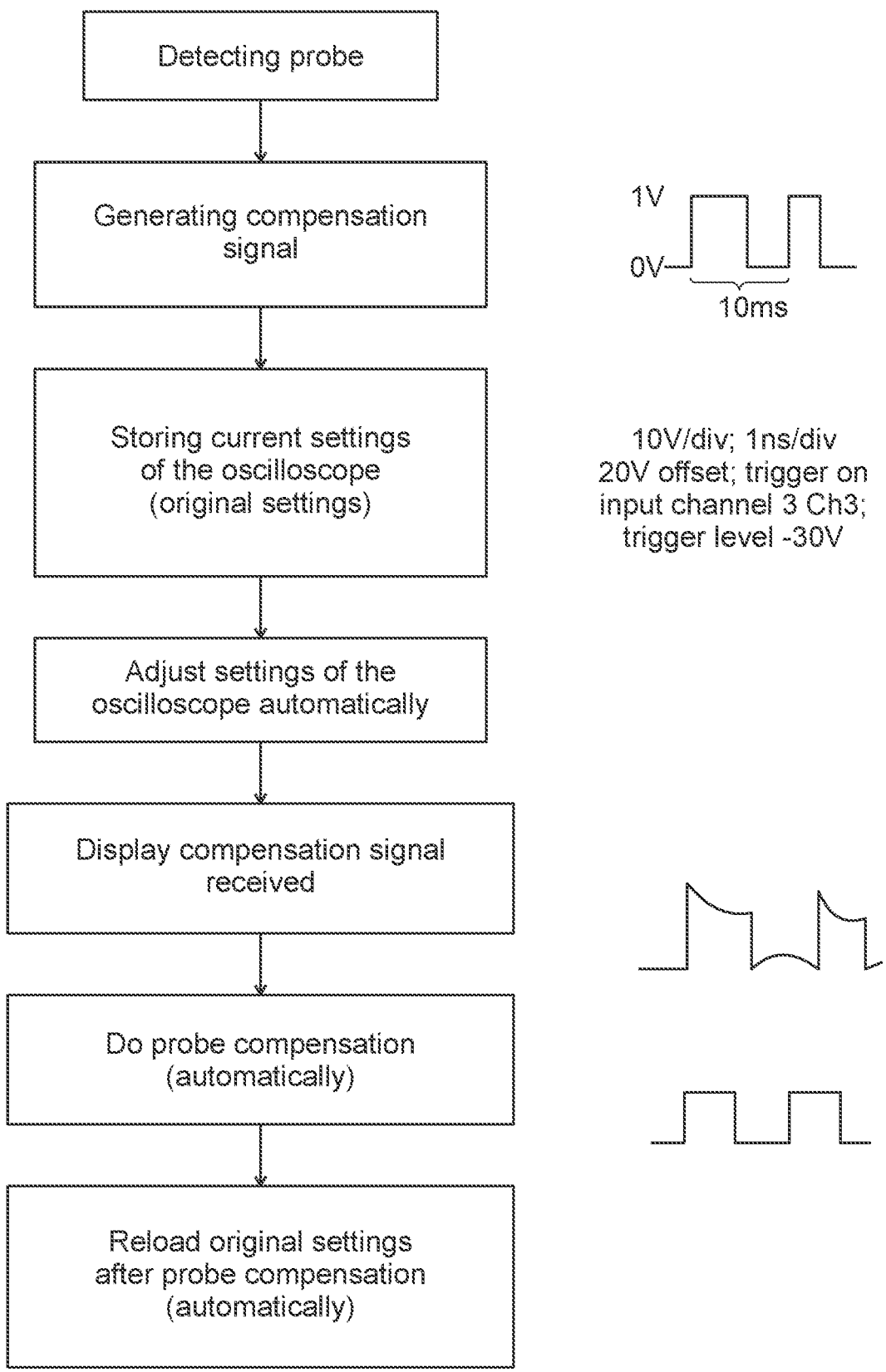
FIG. 3 shows a flow chart representing a method according to an embodiment of the present disclosure.

Such a signal is shown in FIG. 3 illustrating a flow chart of a method that is used by the test and measurement system 10 in order to perform probe compensation.

In a first step, the detection unit 24 detects whether the passive probe 14 is connected to the probe connector 26.

Provided that the detection unit 24 detects the connection, the detection unit 24 controls the compensation signal generator 22 to generate a compensation signal. In the shown embodiment of FIG. 3, the compensation signal is a rectangular signal having amplitude of 1 V and a period of 10 ms.

Then, the current settings of the oscilloscope 12 are stored in a memory 38 that is connected to the processing and control unit 36. The settings of the oscilloscope 12 may be as follows: 10 V/div, 1 ns/div, 20 V offset, trigger on channel 1 and/or trigger level −30 V.

These current settings, also named original settings, of the oscilloscope 12 are automatically saved in the memory 38, for example buffered.

Then, the settings of the oscilloscope 12 are automatically adjusted. While doing so, the compensation signal generated is sensed by the probe 14, for example its tip 28, and forwarded to the first input channel 18 wherein the compensation signal received is processed by the oscilloscope 12 in a typical manner. This means that the compensation signal received is displayed on the display 19. Thus, the settings of the oscilloscope 12 are adjusted such that the compensation signal received can be displayed appropriately.

Moreover, the compensation signal generated may also be displayed on the display 19 for comparison purposes such that the user is enabled to compare both signals visually.

In FIG. 3, the compensation signal received at the input 16 is shown wherein the probe compensation has not taken place. It becomes obvious that the compensation signal received deviates from the compensation signal generated with regard to the shape.

The probe compensation takes place in order to trim the probe 14 with regard to the input capacity of the oscilloscope 12. The probe compensation can be done by adjusting a trimmer of the passive probe 14 manually, for instance by using an adjustment tool such as a screwdriver. The adjustment tool interacts with an adjustment member of the probe 14, for instance a screw. For instance, a probe compensation template is illustrated on the display 19 that provides advices how to trim the probe 14 correctly. For instance, a guide, warning messages and/or an adjustment wizard is shown on the display 19 for supporting the user.

Alternatively, the adjustment of the probe 14 is done automatically by controlling the probe 14, for example a trimmer, via the oscilloscope 12. Hence, control signals are forwarded and processed by the probe 14 that adjust the probe 16 automatically.

In any case, the adjustment of the probe 14 takes place until the trace of the signal forwarded to the first input channel 18, namely the compensation signal received, is within a tolerance area with regard to the compensation signal generated. For instance, a deviation of 2% is acceptable. The tolerance area may be set by the user or by the manufacturer as a kind of presetting, also called default setting. The setting may be adjusted by the user appropriately.

Once the trace reaches the tolerance area, a message may be provided in probe compensation template indicating that the probe compensation was successful.

After the probe compensation has been performed, the probe 14 can be disconnected which is sensed by the detection unit 24. Then, the prior settings of the oscilloscope 12 are reloaded or restored from the memory 38. This reloading step is triggered by the disconnection of the probe 14 as mentioned above.

Hence, the detection unit 24 controls the processing and control unit 36 such that the original settings of the oscilloscope 12 are retrieved from the memory 38.

This reloading is done automatically such that the user does not have to set the oscilloscope 12 manually after the probe compensation. Generally, all settings of the oscilloscope 12 are adjusted automatically.

Accordingly, switching the probe 14 for different measurements do not cause a manual resetting of the oscilloscope 12 resulting in more efficient measurements due to the time saving.

Moreover, the divider factor of the passive probe 14 can be determined automatically by the oscilloscope 12 during probe compensation as the amplitude of the compensation signal received can be measured in order to determine the divider factor. The amplitude of the signal received at the input channel 18 is compared to the compensation signal generated such that the divider factor can be determined easily.

Furthermore, triggering is performed on the clock of the oscilloscope 12 such that it is possible to detect the input channel 18 that is connected to the passive probe 14 automatically. This is possible as the compensation signal generated is known concerning the shape and phase since the compensation signal generated is phase locked with regard to the clock (priori knowledge).

Accordingly, an oscilloscope 12, a test and measurement system 10 as well as a method are provided that enable an efficient probe compensation and measurement of a device under test after probe compensation.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An oscilloscope, comprising:
a compensation signal generator configured to generate a compensation signal;
a probe connector configured to be connected to a passive probe, the probe connector being a specific probe compensation output port of the oscilloscope; and
a detection unit configured to detect whether the passive probe is connected to the probe connector or not,
wherein the detection unit and the compensation signal generator are electrically connected with each other, the detection unit being configured to control the compensation signal generator, the compensation signal generator being connected with the probe connector such that the compensation signal generated is forwarded to the probe connector, a probe compensation being initiated by starting a probe compensation mode of the oscilloscope automatically after the passive probe is connected to the probe connector of the oscilloscope such that the compensation signal generator does not have to continuously provide a compensation signal as the detection unit starts the compensation signal generator provided that the detection unit detects that the passive probe is connected to the probe connector, the oscilloscope adjusting automatically at least one setting of the oscilloscope in the probe compensation mode.

2. The oscilloscope according to claim 1, wherein the compensation signal generator is configured to generate a periodic signal.

3. The oscilloscope according to claim 2, wherein the periodic signal is at least one of a rectangular signal and a sinusoidal signal.

4. The oscilloscope according to claim 1, wherein the probe connector comprises two terminals.

5. The oscilloscope according to claim 4, wherein at least one of the two terminals is established by at least one of a lug, a hook, a loop, or a socket.

6. The oscilloscope according to claim 1, wherein the detection unit comprises at least one of a mechanism, a sensor, and an electrical switch.

7. The oscilloscope according to claim 1, wherein the oscilloscope is configured to automatically determine a divider factor of the probe connected to the probe connector.

8. The oscilloscope according to claim 1, wherein a display is provided that is configured to display a probe compensation template in a probe compensation mode, the probe compensation template helping the user of the oscilloscope to make a proper probe adjustment.

9. A test and measurement system comprising:
a passive probe; and
an oscilloscope
with a compensation signal generator configured to generate a compensation signal, a probe connector configured to be connected to the passive probe and a detection unit configured to detect whether the passive probe is connected to the probe connector or not, the probe connector being a specific probe compensation output port of the oscilloscope, the detection unit and the compensation signal generator being electrically connected with each other, the detection unit being configured to control the compensation signal generator, the compensation signal generator being connected with the probe connector such that the compensation signal generated is forwarded to the probe connector, a probe compensation being initiated by starting a probe compensation mode of the oscilloscope automatically after the passive probe is connected to the probe connector of the oscilloscope such that the compensation signal generator does not have to continuously provide a compensation signal as the detection unit starts the compensation signal generator provided that the detection unit detects that the passive probe is connected to the probe connector, the oscilloscope adjusting automatically at least one setting of the oscilloscope in the probe compensation mode, the probe connector comprising two terminals, the oscilloscope being configured to automatically determine a divider factor of the probe connected to the probe connector.

10. A method for compensating a passive probe comprising:

detecting a passive probe connected to a probe connector of an oscilloscope; starting a probe compensation mode after the passive probe is detected as being connected to the probe connector of the oscilloscope;

adjusting automatically at least one setting of the oscilloscope in the probe compensation mode, wherein the at least one setting is at least one of active channel or disabled channel; and performing a triggering on a clock of the oscilloscope, wherein a compensation signal generated in the probe compensation mode has a frequency that relates to a clock frequency of the oscilloscope such that it is automatically detected to which input channel the passive probe to be compensated is connected.

11. The method according to claim 10, wherein the setting further comprises at least one of horizontal scaling, vertical scaling, offset, position, trigger source, trigger level, or averaging.

12. The method according to claim 10, wherein original settings of the oscilloscope are stored prior to the adjusting step, the original settings being restored after a detection unit detects the disconnection of the probe.

13. The method according to claim 10, wherein a divider factor of the probe is determined automatically by the oscilloscope.

14. The method according to claim 10, wherein the amplitude of a compensation signal received is measured in order to determine a divider factor of the probe.

* * * * *